US009596760B2

(12) United States Patent
Abe et al.

(10) Patent No.: US 9,596,760 B2
(45) Date of Patent: Mar. 14, 2017

(54) ELECTRONIC DEVICE

(71) Applicant: Japan Display Inc., Tokyo (JP)

(72) Inventors: Hideaki Abe, Tokyo (JP); Yasushi Nakano, Tokyo (JP); Hitoshi Kawaguchi, Tokyo (JP); Ryouhei Suzuki, Tokyo (JP)

(73) Assignee: Japan Display Inc., Tokyo (JP)

( * ) Notice: Subject to any disclaimer, the term of this patent is extended or adjusted under 35 U.S.C. 154(b) by 190 days.

(21) Appl. No.: 14/509,119

(22) Filed: Oct. 8, 2014

(65) Prior Publication Data

US 2015/0098197 A1 Apr. 9, 2015

(30) Foreign Application Priority Data

Oct. 8, 2013 (JP) .................................. 2013-210730

(51) Int. Cl.
| | | |
|---|---|---|
| *H05K 1/00* | (2006.01) | |
| *H05K 1/11* | (2006.01) | |
| *H01R 12/62* | (2011.01) | |
| *H05K 5/00* | (2006.01) | |
| *H01R 4/04* | (2006.01) | |
| *H01R 107/00* | (2006.01) | |
| *H05K 3/32* | (2006.01) | |
| *H05K 3/34* | (2006.01) | |
| *H05K 3/36* | (2006.01) | |

(52) U.S. Cl.
CPC ............ *H05K 1/118* (2013.01); *H01R 12/62* (2013.01); *H01R 4/04* (2013.01); *H01R 2107/00* (2013.01); *H05K 3/323* (2013.01); *H05K 3/3442* (2013.01); *H05K 3/361* (2013.01); *H05K 2201/09663* (2013.01); *H05K 2201/09918* (2013.01)

(58) Field of Classification Search
CPC ... H05K 1/02; H05K 5/00; H05K 1/11; H05K 1/0298; H05K 1/028; H05K 1/118; H05K 5/0017; H05K 1/00
USPC ........................................................ 361/749
See application file for complete search history.

(56) References Cited

U.S. PATENT DOCUMENTS

| | | | |
|---|---|---|---|
| 2008/0303123 A1* | 12/2008 | Camacho .......... | H01L 23/49575 257/670 |
| 2011/0048791 A1* | 3/2011 | Ohsawa ................... | C25D 5/02 174/267 |
| 2011/0139493 A1* | 6/2011 | Sumida ............... | G02F 1/13452 174/254 |

FOREIGN PATENT DOCUMENTS

JP 2005-260103 A 9/2005

* cited by examiner

*Primary Examiner* — Eric Thomas
*Assistant Examiner* — Michael P McFadden
(74) *Attorney, Agent, or Firm* — Typha IP LLC

(57) ABSTRACT

Terminal portions are arrayed at regular widths and regular intervals, and each face any enable terminal, and are electrically connected to the enable terminals by conductive particles. A lead portion is connected to the other terminal portion except for a pair of terminal portions which is a pair of terminal portions adjacent to each other, and extends from an overlap region to a lead region. A connection portion connects the respective terminal portions that are not connected with the lead portion to the adjacent terminal portions that are connected to the lead portion within an area of the overlap region. An interval between a pair of lead portions extending from a pair of connection portions located to sandwich a pair of terminal portions that are not connected with the lead portion therebetween is larger than an interval between the other adjacent lead portions.

9 Claims, 11 Drawing Sheets

ELECTRONIC DEVICE

CROSS-REFERENCE TO RELATED APPLICATION

The present application claims priority from Japanese application JP2013-210730 filed on Oct. 8, 2013, the content of which is hereby incorporated by reference into this application.

BACKGROUND OF THE INVENTION

1. Field of the Invention

The present invention relates to an electronic device.

2. Description of the Related Art

A flexible wiring board is used for electric connection of electronic components with an external. Also, an anisotropic conductive material used for joint of the flexible wiring board has been known. The anisotropic conductive material is made of adhesive in which conductive particles are dispersed, and the conductive particles intervene between a terminal of the electronic component and a terminal of a flexible wiring board for conducting an electric connection. Also, the electronic component and the flexible wiring board are mechanically fixed by the adhesive.

Since it is difficult to precisely control the quantity of anisotropic conductive material, the anisotropic conductive material may frequently protrude from the electronic component. In that case, the present inventors have found that a current leaks between the adjacent lines of the flexible wiring board in the protruded portion of the anisotropic conductive material. Particularly, a leakage current is measured between the lines large in potential difference.

SUMMARY OF THE INVENTION

JP 2005-260103 A discloses that the leakage current is eliminated by devising shapes of the terminal of the electronic component, and the terminal of the flexible wiring board. However, a current leakage in an electrically connected region becomes a problem in JP 2005-260103 A whereas a problem to be solved by the present invention resides in a leakage current in a region protruded from the electronic components, which cannot be solved by the disclosure of JP 2005-260103 A.

An object of the present invention is to prevent the leakage current from being generated in the protruded portion of the anisotropic conductive material.

(1) According to the present invention, there is provided an electronic device, including: an electronic component having a plurality of enable terminals; a flexible wiring board that provides a wiring pattern having an overlap region which overlaps with the electronic component, and a lead region different from the overlap region; and an anisotropic conductive material that joins the electronic component and the overlap region, wherein the wiring pattern includes: terminal portions that are linearly formed, arrayed in the overlap region, and include a first terminal portion facing the enable terminals, and a plurality of second terminal portions disposed on an outside of the first terminal portion, a lead portion that is disposed in the lead region, and includes two first lead portions which are connected to the second terminal portions adjacent to the first terminal portion, and a plurality of second lead portions that is disposed at regular intervals outside of the two first lead portions, and merges two of the second terminal portions into one terminal portion, and a connection portion that connects the first terminal portion and the second terminal portions adjacent to the first terminal portion in the overlap region, in which an interval of the two first lead portions is larger than the regular intervals.

(2) In the electronic device according to the item 1, at least a set of the first terminal portions may face the enable terminals adjacent to each other input and output so as to provide a largest potential difference among the plurality of enable terminals.

(3) In the electronic device according to the item (2), the connection portion may be arranged within a region of the same enable terminals that face the first terminal portion and the second terminal portions adjacent to each other which are connected electrically by the connection portion.

(4) According to the present invention, there is provided an electronic device, including: an electronic component having a dummy terminal and a plurality of enable terminals; a flexible wiring board that provides a wiring pattern having an overlap region which overlaps with the electronic component, and a lead region different from the overlap region; and an anisotropic conductive material that joins the electronic component and the overlap region, in which the wiring pattern includes: a plurality of terminal portions that are arrayed at regular widths in the overlap region, and face the dummy terminal or the enable terminals through the anisotropic conductive material.

(5) In the electronic device according to the item (4), the dummy terminal may be sandwiched between a pair of the enable terminals, and a potential difference between the pair of enable terminals closest to each other which sandwich the dummy terminal therebetween may be input and output so as to be largest in the potential difference between the plurality of enable terminals adjacent to each other.

(6) In the electronic device according to the item 5, the wiring pattern may include a lead portion that is connected to the other terminal portions except for at least the terminal portions electrically connected to the dummy terminal, and extends from the overlap region to the lead region.

(7) In the electronic device according to the item (1), a part of the anisotropic conductive material may be placed on the wiring pattern in the lead region.

(8) The electronic device according to the item (5), apart of the anisotropic conductive material may be placed on the wiring pattern in the lead region.

(9) In the electronic device according to the item (1), the flexible wiring board may include a coating layer that covers the wiring pattern in the lead region, the coating layer may be formed to expose a part of the wiring pattern in a region adjacent to the overlap region, and the part of the anisotropic conductive material may be placed on the part exposed from the coating layer of the wiring pattern in the lead region.

(10) In the electronic device according to the item (5), the flexible wiring board may include a coating layer that covers the wiring pattern in the lead region, the coating layer may be formed to expose a part of the wiring pattern in a region adjacent to the overlap region, and the part of the anisotropic conductive material may be placed on the part exposed from the coating layer of the wiring pattern in the lead region.

(11) In the electronic device according to the item (1), the electronic component may include a display panel.

(12) In the electronic device according to the item (5), the electronic component may include a display panel.

DETAILED DESCRIPTION OF THE INVENTION

Hereinafter, embodiments of the present invention will be described with reference to the accompanying drawings. In the following description, a display device is a specific example of an electronic device according to the present invention, and a liquid crystal display device will be described as an example of the display device. However, the present invention can be applied to the other display devices (for example, EL (electroluminescent) display device).

First Embodiment

Figure 1:
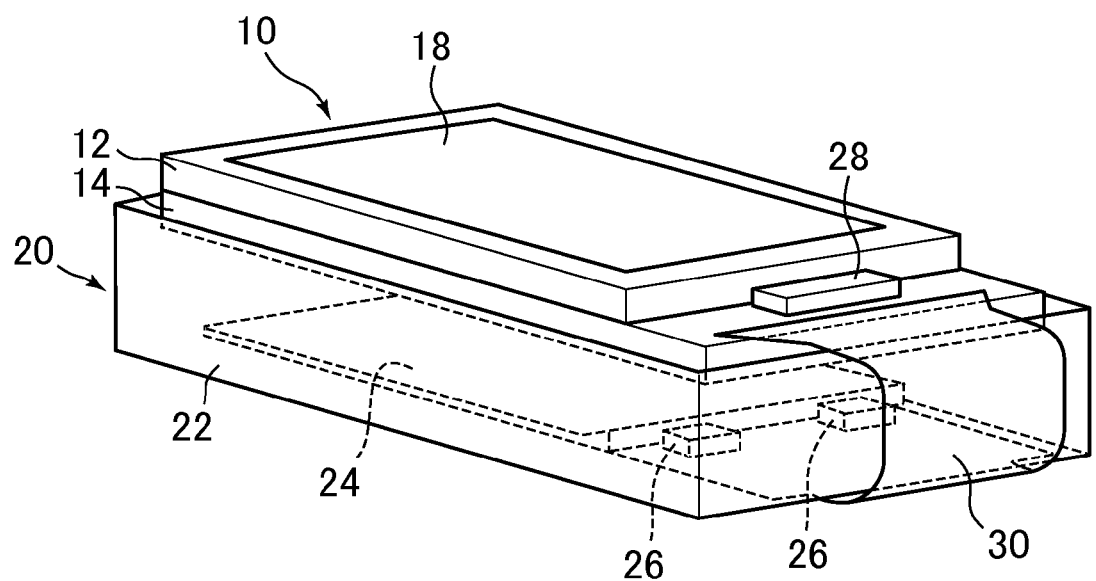
FIG. 1 is a perspective view illustrating an outline of a liquid crystal display device according to an embodiment of the present invention.

FIG. 1 is a perspective view illustrating an outline of a liquid crystal display device according to an embodiment of the present invention. The liquid crystal display device that exemplifies the electronic device includes a liquid crystal display panel 10 which is an example of an electronic component. The liquid crystal display panel 10 is a specific example of the display panel.

Figure 2:
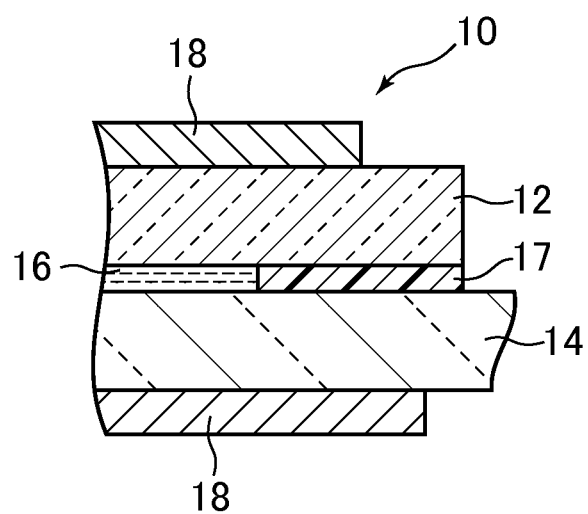
FIG. 2 is a partially enlarged perspective view illustrating a liquid crystal display panel.

FIG. 2 is a partially enlarged perspective view illustrating the liquid crystal display panel 10. The liquid crystal display panel 10 includes a first substrate 12 and a second substrate 14 stacked on each other. The first substrate 12 and the second substrate 14 are each formed of a light transmissive substrate made of glass, and a liquid crystal material 16 is sealed between the first substrate 12 and the second substrate 14 with a sealant 17. The first substrate 12 is formed of a color filter substrate, and the second substrate 14 is formed of a TFT (thin film transistor) substrate (or array substrate) including thin film transistors, pixel electrodes, and lines not shown. A polarizing plate 18 is attached to each of the first substrate 12 and the second substrate 14.

As illustrated in FIG. 1, the liquid crystal display device has a backlight unit 20 that supplies light to the liquid crystal display panel 10. The backlight unit 20 includes a frame 22 fixed with the liquid crystal display panel 10. In the frame 22 are housed a light guide plate 24, a light source 26 (for example, light emitting diode), an optical sheet (spread sheet, prism sheet) not shown located on the light guide plate 24 (a side of the liquid crystal display panel 10), and a reflective sheet not shown located under the light guide plate 24 (a side opposite to an optical sheet group).

One side of the second substrate 14 protrudes from one side of the first substrate 12. On a portion of the second substrate 14 protruded from the first substrate 12 is mounted an integrated circuit chip 28 incorporating a driver circuit for driving a liquid crystal material 16 therein. Also, a flexible wiring board 30 is attached to the portion of the second substrate 14 protruded from the first substrate 12. The flexible wiring board 30 is bent outside of the frame 22, and extends to a lower side (a side opposite to the liquid crystal display panel 10) of the frame 22. Light sources 26 are mounted on the flexible wiring board 30, and arranged adjacent to an end of the light guide plate 24.

Figure 3:
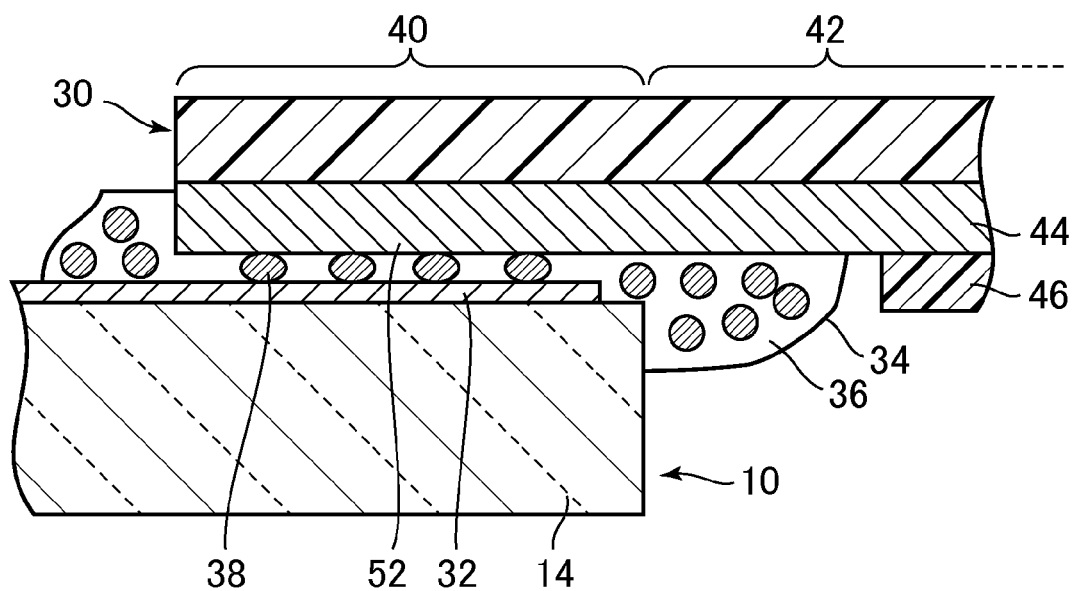
FIG. 3 is a cross-sectional view illustrating a joint portion of the liquid crystal display panel and a flexible wiring board.
Figure 4:
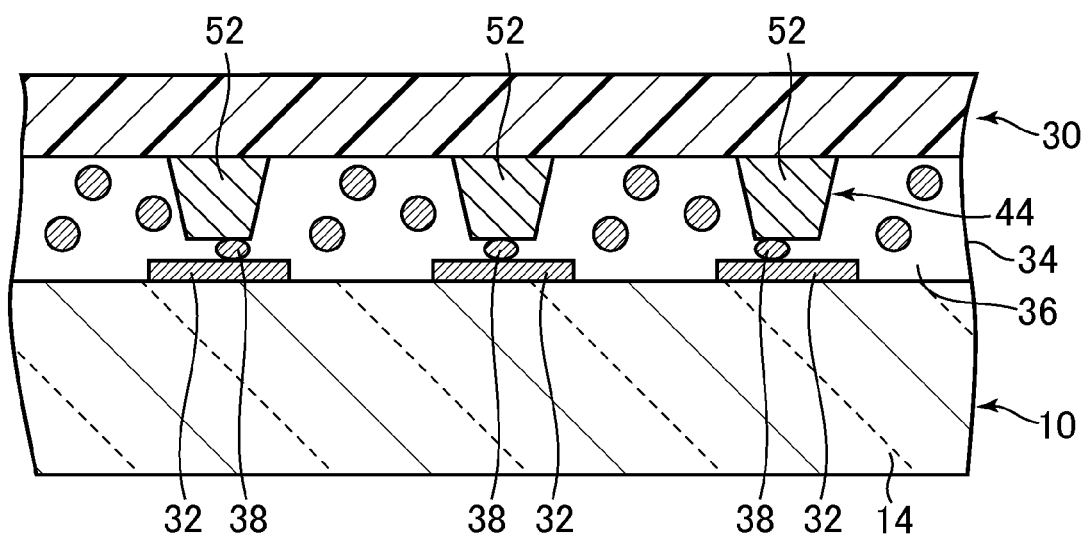
FIG. 4 is another cross-sectional view illustrating the joint portion of the liquid crystal display panel and the flexible wiring board.

FIGS. 3 and 4 are cross-sectional views illustrating a joint portion of the liquid crystal display panel 10 and the flexible wiring board 30. FIGS. 3 and 4 illustrate cross-sections orthogonal to each other.

The liquid crystal display panel 10 has plural enable terminals 32 for input/output on an end thereof. The "input/output" includes not only input/output of a signal, but also input/output of a current or a voltage, and also includes a connection for ground. The enable terminals 32 are each electrically connected to an integrated circuit chip 28 and a driver circuit including a circuit incorporated into the liquid crystal display panel 10 for driving a liquid crystal material 16. Therefore, a terminal that is in a floating state is not the enable terminal 32. Also, the potentials of the respective enable terminals 32 are not always identical with each other, and potential differences of the enable terminals 32 adjacent to each other are not even. That is, since the potential difference of any pair of enable terminals 32 adjacent to each other is larger than that of another pair of enable terminals 32 adjacent to each other, at least one pair of the paired enable terminals 32 adjacent to each other (enable terminals 32a, 32b to be described later) input and output to provide the largest potential difference are present.

The flexible wiring board 30 is extended while being joined to the liquid crystal display panel 10. The flexible wiring board 30 is joined to the liquid crystal display panel 10 by an anisotropic conductive material 34 (for example, anisotropic conductive film). The anisotropic conductive material 34 has conductive particles 38 dispersed in an adhesive 36.

As illustrated in FIG. 3, the flexible wiring board 30 has a wiring pattern 44. The flexible wiring board 30 includes an overlap region 40 that overlaps with the liquid crystal display panel 10 when viewed from a direction perpendicular to a surface (surface on which the enable terminals 32 of the second substrate 14 are formed) attached with the flexible wiring board 30. A part of the wiring pattern 44 passes through the overlap region 40. The flexible wiring board 30 includes a lead region 42 protruded and extended from the liquid crystal display panel 10. Another part of the wiring pattern 44 passes through the lead region 42. The flexible wiring board 30 has the wiring pattern 44 formed from the overlap region 40 to the lead region 42. The flexible wiring board 30 has a coating layer 46 that covers the wiring pattern 44 in the lead region 42. The coating layer 46 is formed to expose a part of the wiring pattern 44 in a region adjacent to the overlap region 40. The anisotropic conductive material 34 intervenes between the liquid crystal display panel 10 and the flexible wiring board 30, and performs an electric connection between the enable terminals 32 and the wiring pattern 44 by the conductive particles 38. The anisotropic conductive material 34 protrudes into the lead region 42 from the overlap region 40. Apart of the anisotropic conductive material 34 is placed on an exposed portion of the wiring pattern 44 from the coating layer 46 in the lead region 42.

Figure 5:
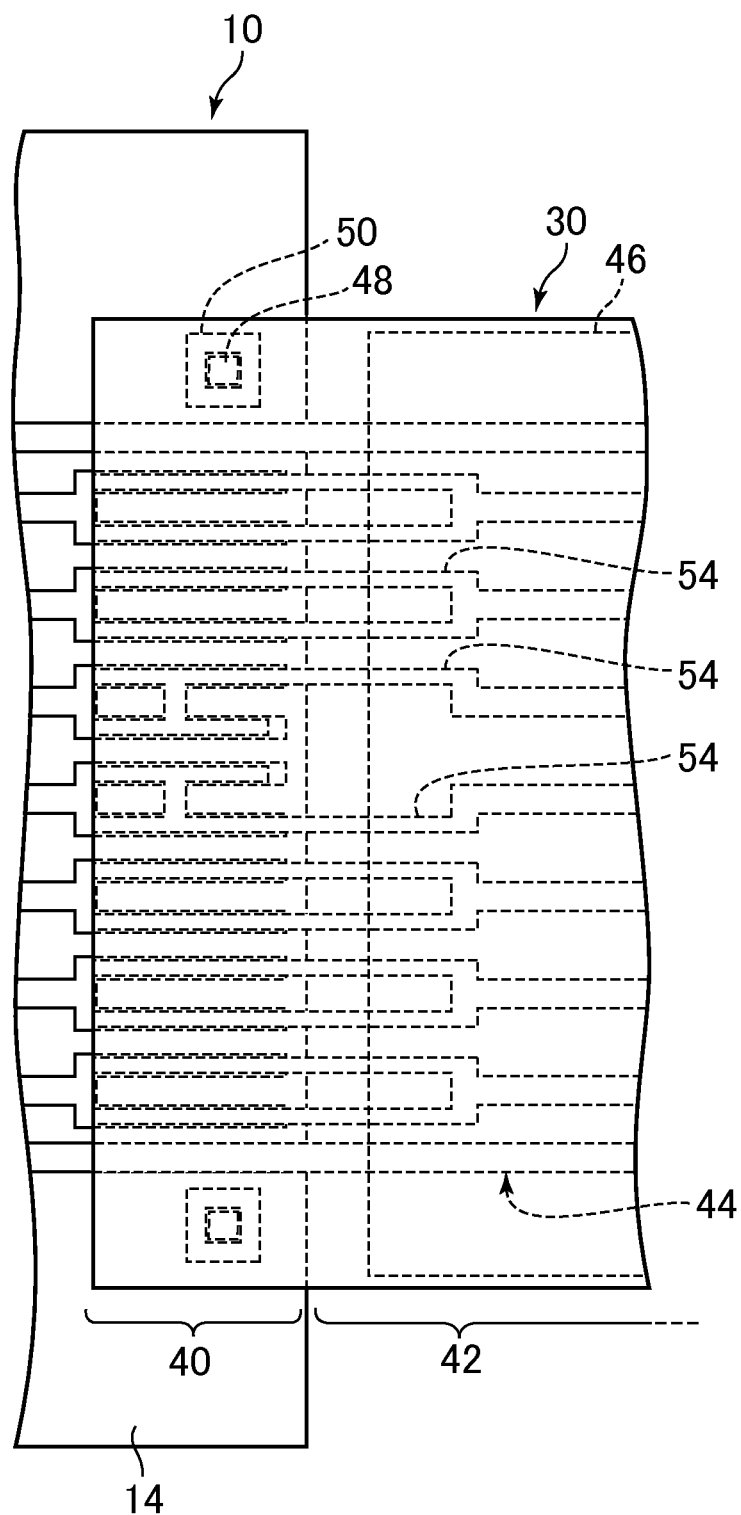
FIG. 5 is a plan view illustrating the joint portion of the liquid crystal display panel and the flexible wiring board.

FIG. 5 is a plan view illustrating the joint portion of the liquid crystal display panel 10 and the flexible wiring board 30.

Figure 6:
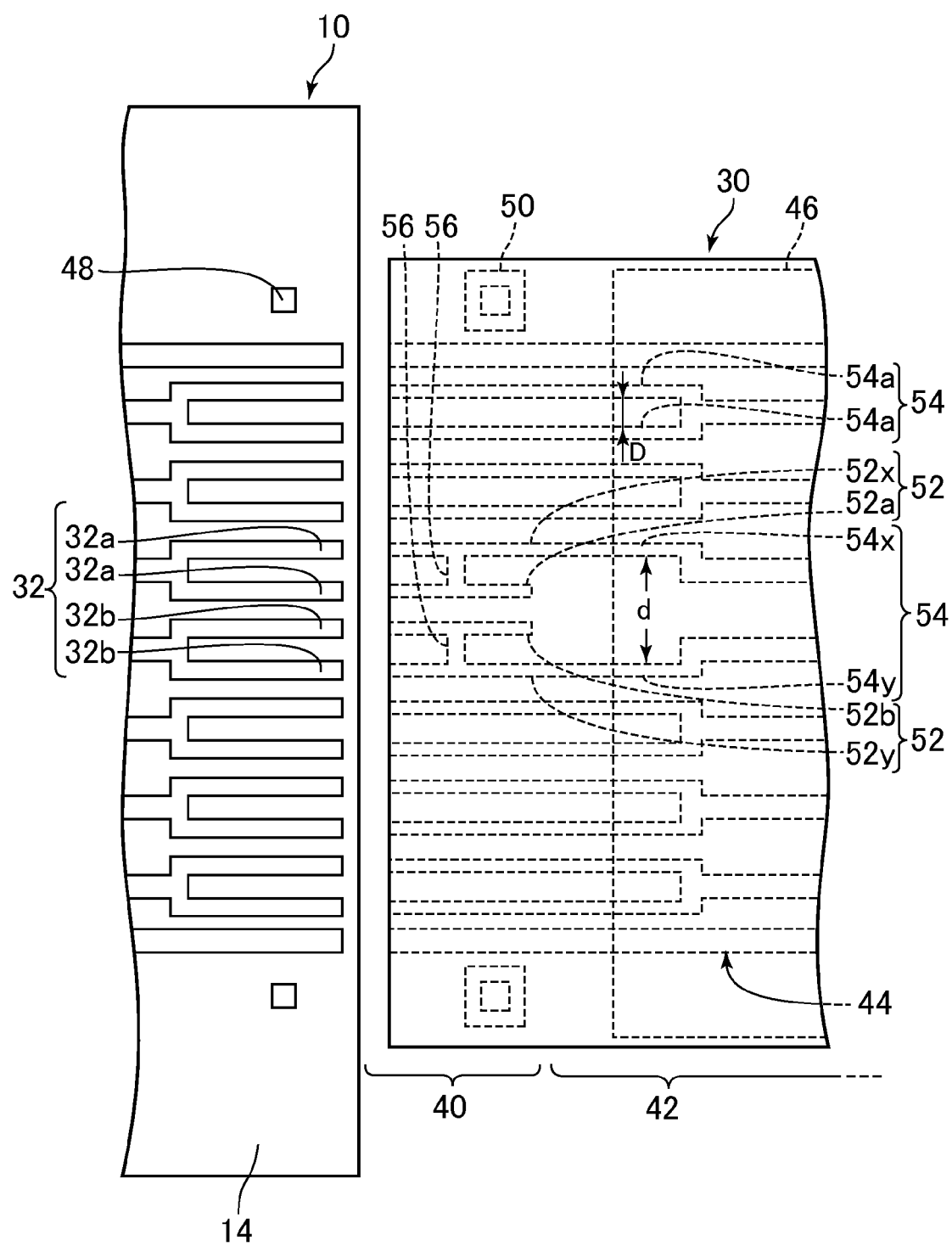
FIG. 6 is a plan view illustrating the liquid crystal display panel and the flexible wiring board, separately.

FIG. 6 is a plan view illustrating the liquid crystal display panel 10 and the flexible wiring board 30, separately. The liquid crystal display panel 10 and the flexible wiring board 30 are provided with positioning marks 48 and 50, respectively, and joined to each other at an accurate position.

As illustrated in FIG. 6, respective enable terminals 32a are linearly formed, located on an end of the second substrate 14 which is joined to the flexible wiring board 30, and extend from a periphery of the terminal toward a direction of the internal of the second substrate 14. A pair of enable terminals 32a adjacent to each other is merged into one line. In other words, one line includes a main body portion that extends from the internal of the second substrate 14 toward a direction of the periphery thereof, and a pair of branch portions extending in direction opposite to each other so as to be forked from the main body portion. In the example of FIG. 6, the pair of branch portions is adjacent to the main body portion. The branch portion extends in a direction along the periphery of the end of the second substrate 14 which is joined to the flexible wiring board 30, and is connected to a pair of enable terminals 32a. The branch portion and the pair of enable terminals 32a adjacent to each other are formed integrally into a U-shape (U-shape down to the right). A pair of the enable terminals 32a branched from the line has the same potential. A pair of enable terminals 32b and 32b adjacent to the pair of enable terminals 32a also has the same configuration as that of the enable terminals 32a. Since the enable terminals 32a and the enable terminals 32b do not conduct each other, potentials of those enable terminals 32a and 32b are different from each other. The enable terminals 32a and 32b adjacent to each other and different in potential therebetween are branched from a pair of lines adjacent to each other, and adjacent to each other.

As illustrated in FIG. 6, the wiring pattern 44 includes plural terminal portions 52 on an end of the flexible wiring board 30. The respective terminal portions 52 are linearly formed. The respective terminal portions 52 are arrays at regular widths and regular intervals within the overlap region 40. As illustrated in FIGS. 3 and 4, the plural terminal portions 52 face the corresponding enable terminals 32, and are electrically connected to the enable terminals 32 by the conductive particles 38.

As illustrated in FIGS. 5 and 6, the wiring pattern 44 includes lead portions 54. The respective lead portions 54 are linearly formed. The lead portions 54 are connected to the terminal portions 52, extend from the overlap region 40 to the lead region 42, and are located apart from the end of the flexible wiring board 30 as compared with the terminal portions 52. The lead portions 54 are not connected to at least one set of terminal portions 52 including pairs of terminal portions 52a and 52b adjacent to each other. The pairs of terminal portions 52a and 53b adjacent to each other represent terminals electrically connected to face the enable terminals 32a and 32b adjacent to each other input and output so as to provide the largest potential difference among the plural enable terminals 32, as described above. The respective terminal portions 52a and 52b which are not connected with the lead portions 54 are connected to terminal portions 52x and 52y which are adjacent to the terminal portions 52a and 52b, and connected with the lead portions 54. This connection is formed by connection portions 56 within the overlap region 40. In the example of FIG. 6, the respective connection portions 56 are disposed between the terminal portion 52a and the terminal portions 52x, and between the terminal portion 52b and the terminal portions 52y. The connection portions 56 may be linearly formed, but the shape thereof are not particularly restricted.

At least one set of lead portions 54 including two or more lead portions 54a adjacent to each other are merged into one line in the lead region 42. The respective terminal portions 52 connected to the two lead portions 54a merged into one line have the same potential. The lead portion 54x or 54y connected to the terminal portion 52a or 52b, which is not connected with the lead portion 54, by the connection portion 56 does not merge with another lead portion 54.

An interval d between the pair of lead portions 54x and 54y extended from the pair of terminal portions 52x and 52y at positions for sandwiching the pair of terminal portions 52a and 52b not connected with the lead portion 54 is larger than an interval between other lead portions 54 adjacent to each other. As illustrated in FIG. 3, a part of the anisotropic conductive material 34 protrudes from between the liquid crystal display panel 10 and the flexible wiring board 30, and is placed on the wiring pattern 44 in the lead region 42.

According to this embodiment, a pair of terminal portions 52x and 52y closest to each other is located, and the pair of lead portions 54x and 54y is extended on both sides that sandwiches the pair of terminal portions 52a and 52b which are not connected with the lead portions 54. Since the interval d between the pair of lead portions 54x and 54y sandwich the pair of terminal portions 52a and 52b, the interval d is larger than the interval D between the other lead portions 54 adjacent to each other and closest to each other. Therefore, even if a part of the anisotropic conductive material 34 is placed on the wiring pattern 44 in the lead region 42, a leakage current can be prevented from being generated between the pair of lead portions 54x and 54y having a large interval therebetween.

If the anisotropic conductive material 34 protrudes into a region of the lead region 42 except for the coating layer 46, a leakage current that flows on the surface of the anisotropic conductive material 34 or into the anisotropic conductive material 34 is problematic. On the other hand, in the case of the anisotropic conductive material 34 in the overlap region 40, a leakage between the terminal portion 52a and the terminal portion 52b is not problematic. Since the lead portion 54x and the lead portion 54y which produce a large potential difference from each other are present in the overlap region 40, a leakage through the anisotropic conductive material 34 is not problematic even if those lead portions are closer to each other. Since the large interval d is present in the lead region 42, the leakage through the anisotropic conductive material 34 is sufficiently suppressed. Since the lead portion 54x and the lead portion 54y are present in the overlap region 40, and the connection portions 56 are present in the overlap region 40, a forked connection (two enable terminals 32a, two enable terminals 32b) is enabled, and the above-mentioned leakage is suppressed while ensuring the connection reliability. If the lead portion 54x, the lead portion 54y, and the connection portions 56 are located in the region except for the coating layer 46 in the lead region 42, leakage is generated from the lead portion 54x and the lead portion 54y through a leakage path of the anisotropic conductive material 34 between the terminal portion 52a and the terminal portion 52b from a relationship of the electric connection. For that reason, a sufficient distance is not taken, resulting in excessive problems. Hence, the lead portion 54x, the lead portion 54y, and the connection portions 56 must be arranged within the overlap region.

Figure 7:
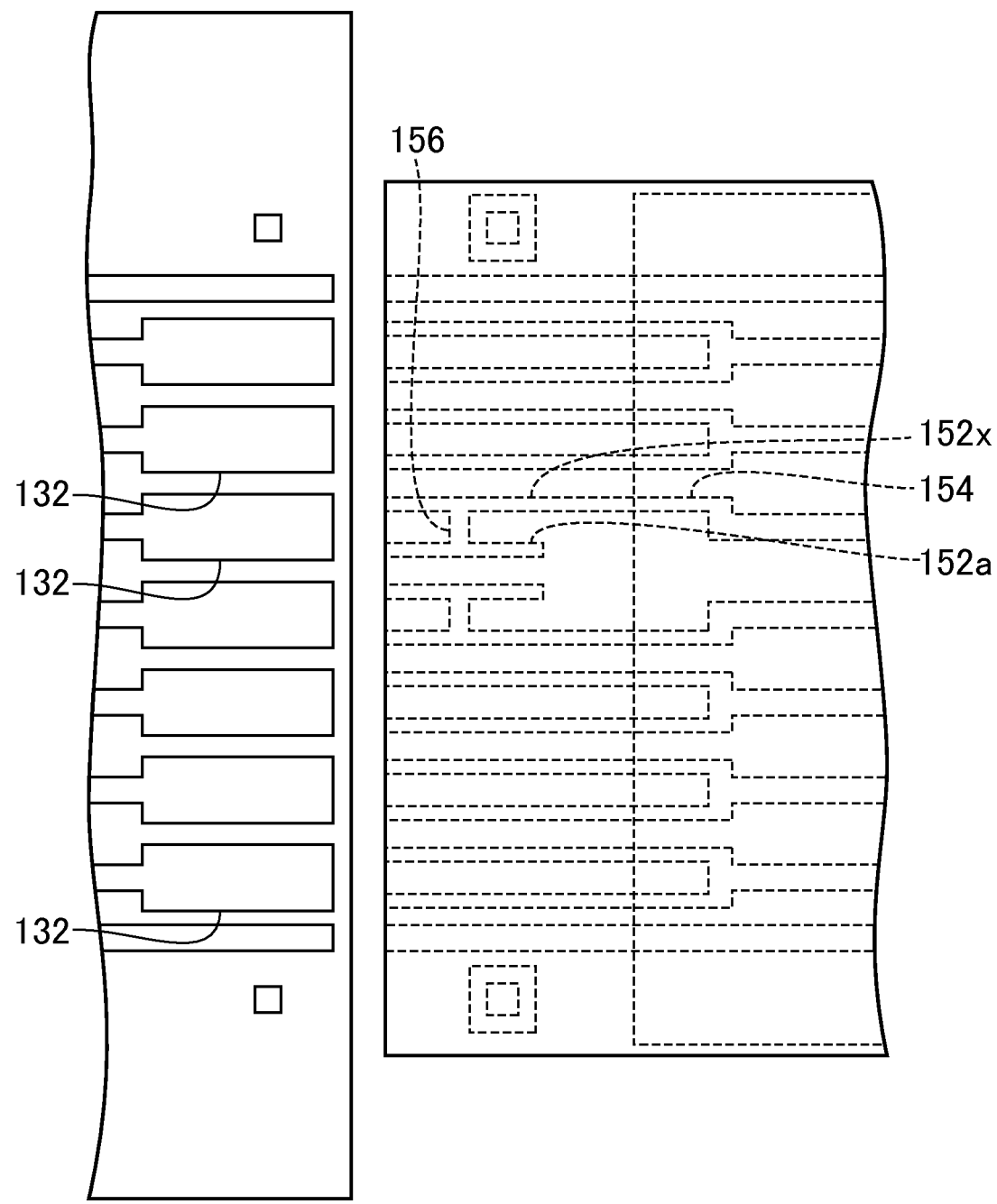
FIG. 7 is a diagram illustrating a modification of an enable terminal.

FIG. 7 is a diagram illustrating a modification of the enable terminal. Each of enable terminals 132 illustrated in FIG. 7 is configured by integrating the pair of enable terminals 32 illustrated in FIG. 6. Therefore, one terminal portion 152a not connected with a lead portion 154, and one terminal portion 152x connected with the lead portion 154, which are located adjacent to each other, and electrically connected to each other by a connection portion 156, are electrically connected to the same one enable terminal 132. The connection portion 156 is arranged within a region of the same one enable terminal 132 electrically connected with the terminal portions 152a and 152x adjacent to each other.

Figure 8:
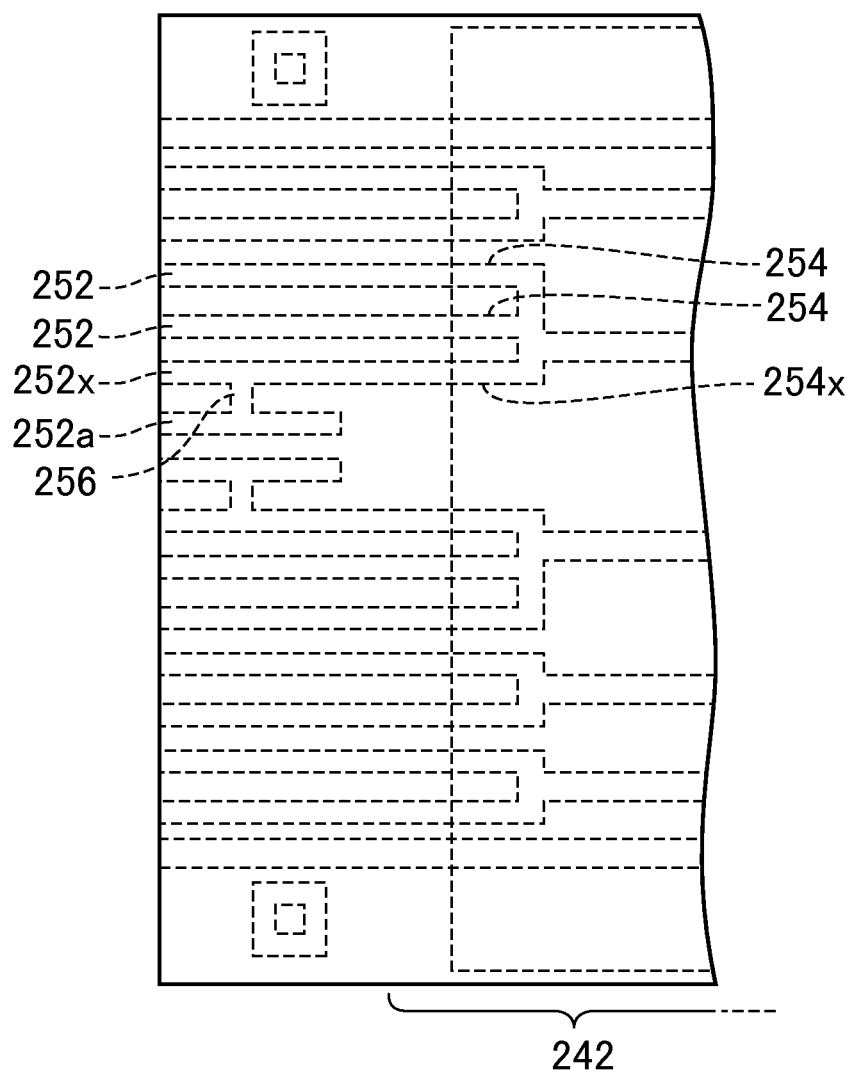
FIG. 8 is a diagram illustrating a modification 1 of a lead portion.

FIG. 8 is a diagram illustrating a modification 1 of the lead portion. In this example, two lead portions 254 adjacent to each other are merged into one line in a lead region 242. Also, a lead portion 254x connected to a terminal portion 252a not connected with a lead portion 254 by a connection portion 256 is further merged with the lead portions 254 merged with each other. Therefore, four terminal portions 252 including three terminal portions 252, 252 and 252x connected with the three merged lead portions 254, 254, and 254x, respectively, and a terminal portion 252a not connected with the lead portion 254 have the same potential.

Figure 9:
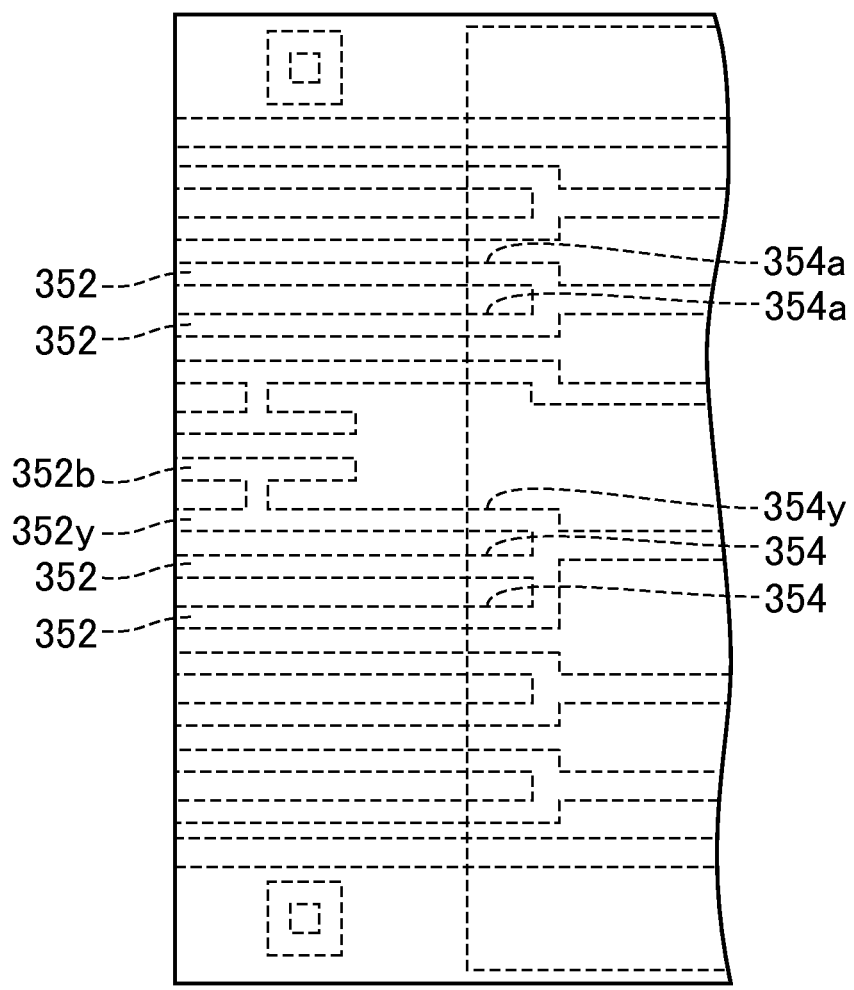
FIG. 9 is a diagram illustrating a modification 2 of the lead portion.

FIG. 9 is a diagram illustrating a modification 2 of the lead portion. This example is the combination of the example of FIG. 6 with FIG. 8. As in the example FIG. 6, two lead portions 354a are merged together with the result that two terminal portions 352 have the same potential. Also, as in the example of FIG. 8, three lead portions 354, 354, and 354y are merged together with the result that three terminal portions 352, 352, and 352y have the same potential, and a terminal portion 352b not connected with the lead portion 354 is connected to the terminal portion 352y, and have the same potential. As a result, four terminal portions 352, 352, 352y, and 352b in total have the same potential.

Second Embodiment

Figure 10:
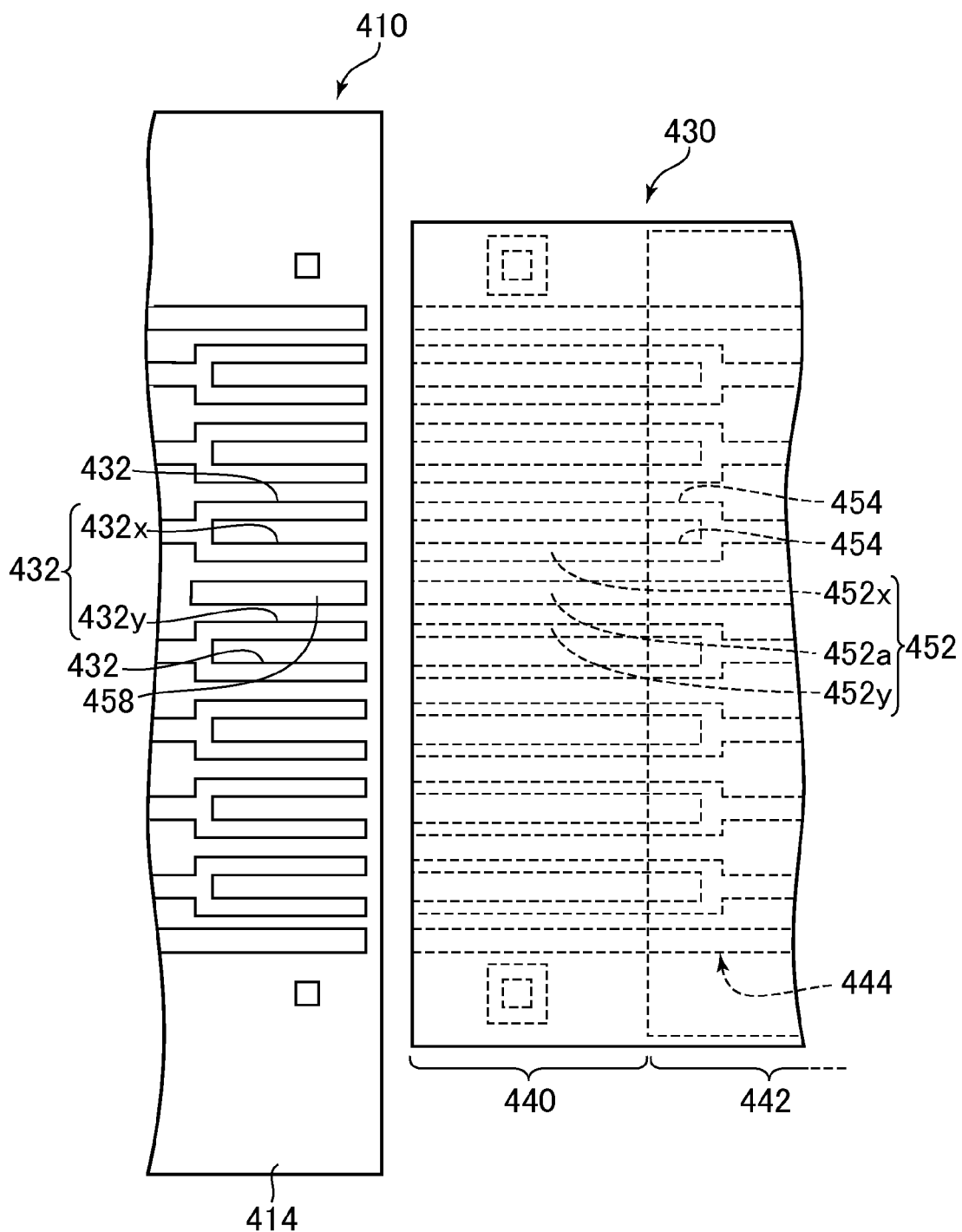
FIG. 10 is a plan view illustrating a liquid crystal display panel and a flexible wiring board according to a second embodiment, separately.

FIG. 10 is a plan view illustrating a liquid crystal display panel and a flexible wiring board according to a second embodiment, separately.

In this embodiment, a liquid crystal display panel 410 includes plural enable terminals 432, and a dummy terminal 458 not used for input/output. The two enable terminals that sandwich the dummy terminal 458 therebetween, and are closest to each other among the enable terminals 432 are denoted by 432x and 432y.

Each of the plural enable terminals 432 is linearly formed, and located on an end of a second substrate 414 which is joined to a flexible wiring board 430, and extends in a direction of the interior of a second substrate 414 from a periphery of that end. A pair of enable terminals 432 adjacent to each other is merged into one line. In other words, one line includes a main body portion that extends from the internal of the second substrate 414 toward a direction of the periphery thereof, and a pair of branch portions extending in direction opposite to each other so as to be forked from the main body portion. In the example of FIG. 10, the pair of branch portions is a portion extending adjacent to the main body portion in a direction along a periphery of an end of the second substrate 414 which is joined to a flexible wiring board 430, and connected to a pair of enable terminals 432. The branch portion and the pair of enable terminals 432 adjacent to each other are formed integrally into a U-shape (U-shape down to the right in FIG. 10).

A dummy terminal 458 is in a floating state. Plural terminal portions 452 of a wiring pattern 444 face the corresponding enable terminals 432 or the dummy terminal 458, and are electrically connected thereto by conductive particles. A potential difference between a pair of enable terminals 432x and 432y that sandwich the dummy terminal 458, and are closest to each other is largest among the potential differences of the enable terminals 432 adjacent to each other.

The wiring pattern 444 includes lead portions 454. The respective lead portions 454 are connected to plural terminal portions 452, and extended to a lead region 442 from an overlap region 440. At least one set of lead portions 454 including two or more lead portions 454 which are electrically connected to any enable terminals 432, and adjacent to each other is formed to be merged into one line in a lead region 442.

According to this embodiment, a pair of enable terminals 432x and 432y largest in the potential difference is arranged to sandwich the dummy terminal 458 therebetween. The terminal portions 452 of the wiring pattern 444 which are electrically connected to the enable terminals 432 and the dummy terminal 458 are arrays at regular widths and at regular intervals. For that reason, an interval between the pair of terminal portions 452x and 452y which is connected to the pair of enable terminals 432x and 432y that sandwich the dummy terminal 458 therebetween, and is closest to each other is larger than intervals of the other terminal portions 452. Therefore, even if a part of the anisotropic conductive material is placed on the wiring pattern 444 in the lead region 442, a leakage current can be prevented from being generated between the pair of terminal portions 452x and 452y having a large interval therebetween. The details described in the first embodiment are applied to this embodiment except for the above configurations.

With the provision of the dummy terminal 458, and the terminal portions 452a connected to the dummy terminal 458, the wiring pattern 444 and the enable terminals 432 can be arranged at regular pitches. Further, as described above, the leakage current can be prevented.

Figure 11:
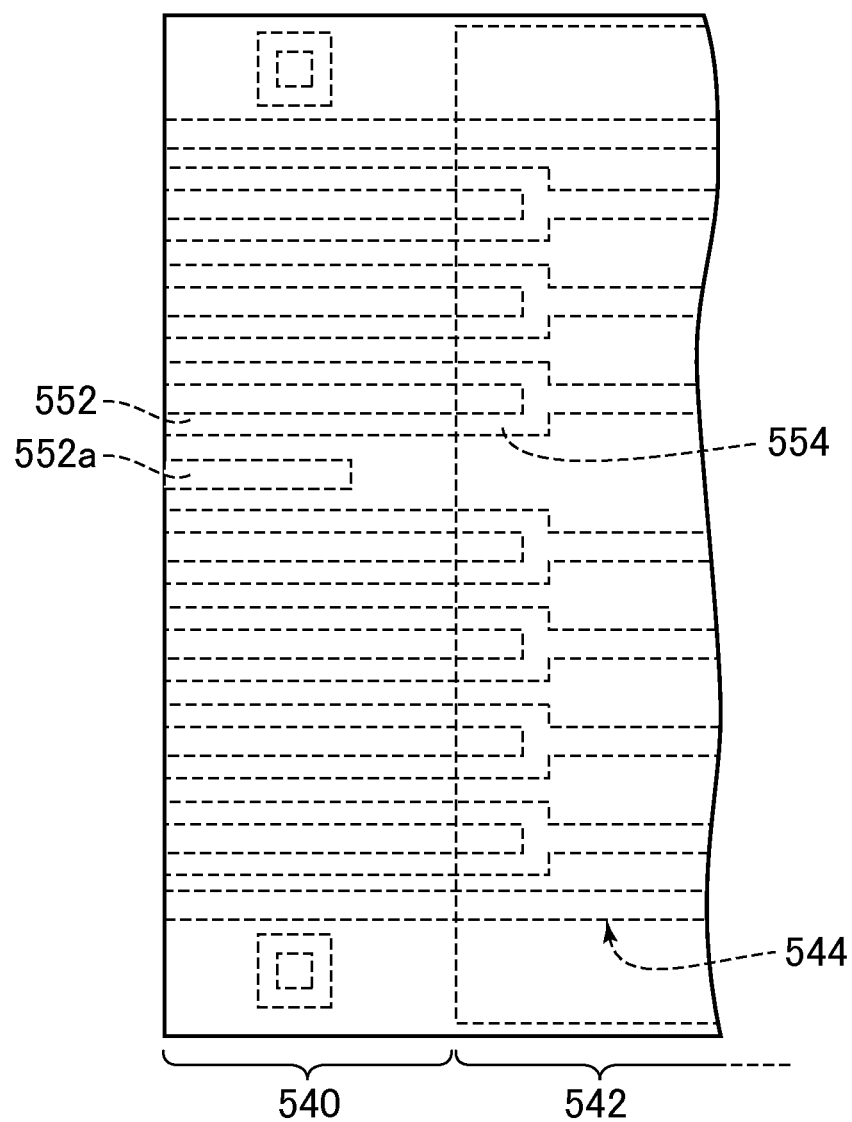
FIG. 11 is a diagram illustrating a modification of the second embodiment.

FIG. 11 is a diagram illustrating a modification of the second embodiment. In this example, a wiring pattern 544 includes lead portions 554. Each of the lead portions 554 is connected to a corresponding terminal portion 552, and extends to a lead region 542 from an overlap region 540. The lead portion 554 are not connected to at least a terminal portion 552a electrically connected to a dummy terminal. The other details correspond to those described in the above second embodiment.

The present invention is not limited to the embodiments described above and various modifications may be made thereto. For example, each configuration described in the embodiment can be replaced by a substantially same configuration, a configuration exerting the same operation and advantage or a configuration attaining the same object.

What is claimed is:
1. A display device, comprising:
a display panel having a plurality of enable terminals;
a flexible wiring board having an overlap region which overlaps with the display panel, and a lead region different from the overlap region, the flexible wiring board having a plurality of wiring patterns, each of the plurality of wiring patterns having a first terminal portion and a second terminal portion that are linearly formed and arrayed in the overlap region; and an anisotropic conductive material that joins the display panel and the overlap region, the anisotropic conductive material connecting the enable terminals to the first terminal portion and the second terminal portion, wherein the plurality of wiring patterns include a first wiring pattern, a second wiring pattern, and other wiring patterns, the first wiring pattern has a first lead portion disposed in the lead region and connected to the first terminal portion, the first wiring pattern has no lead portion connected to the second terminal portion, the first wiring pattern has a first connection portion that connects the first terminal portion and the second terminal portion in the overlap region, the second wiring pattern has a second lead portion disposed in the lead region and connected to the second terminal portion, the second wiring pattern has no lead portion connected to the first terminal portion, the second wiring pattern has a second connection portion that connects the first terminal portion and the second terminal portion in the overlap region, the other wiring patterns each has a pair of third lead portions disposed in the lead region at a first interval therebetween and connected to the first terminal portion and the second terminal portion, the pair of third lead portions merge into another lead portion, the second terminal portion of the first wiring pattern is adjacent to the first terminal portion of the second wiring pattern, the first lead portion of the first wiring pattern and the second lead portion of the second wiring pattern are arranged at a second interval therebetween, and the second interval is larger than the first interval.

2. The display device according to claim 1, wherein the first terminal portion of the first wiring pattern and the second terminal portion of the second wiring pattern respectively face a pair of enable terminals adjacent to each other, which have larger potential difference than any other pair of the plurality of enable terminals.

3. The display device according to claim 2, wherein the first wiring pattern has the first connection portion within a region of one of the plurality of enable terminals that face the first terminal portion and the second terminal portion of the first wiring pattern, and the second wiring pattern has the second connection portion within a region of another of the plurality of enable terminals that face the first terminal portion and the second terminal portion of the second wiring pattern.

4. A display device, comprising:

a display panel having a dummy terminal and a plurality of enable terminals;

a flexible wiring board having an overlap region which overlaps with the display panel, and a lead region different from the overlap region, the flexible wiring board having a plurality of wiring patterns, the plurality of wiring patterns include a plurality of first wiring patterns and a second wiring pattern; and an anisotropic conductive material that joins the display panel and the overlap region, wherein the plurality of first wiring patterns each has a first terminal portion and a second terminal portion that are connected to a pair of the enable terminals adjacent to each other with the anisotropic conductive material, the plurality of first wiring patterns each having a first lead portion and a second lead portion disposed in the lead region and connected to the first terminal portion and the second terminal portion respectively, the first lead portion and the second lead portion merge into another lead portion, the second wiring pattern has a third terminal portion connected to the dummy terminal with the anisotropic conductive material, the second wiring pattern has a third lead portion disposed in the lead region and connected to the third terminal portion, and the first terminal portion, the second terminal portion and the third terminal portion are arranged in the overlap region and have an equivalent width in an arrangement direction.

5. The display device according to claim 4, wherein the third terminal portion is sandwiched between the first terminal portion of one of the plurality of first wiring patterns and the second terminal portion of another of the plurality of first wiring patterns, and wherein the first terminal portion and the second terminal portion that sandwich the third terminal portion are configured to have a potential difference larger than any pair of the plurality of enable terminals adjacent to each other.

6. The display device according to claim 1, wherein a part of the anisotropic conductive material is placed on the plurality of wiring patterns in the lead region.

7. The display device according to claim 5, wherein a part of the anisotropic conductive material is placed on the plurality of wiring patterns in the lead region.

8. The display device according to claim 6, wherein the flexible wiring board includes a coating layer that covers the plurality of wiring patterns in the lead region, wherein the coating layer is formed to expose a part of the plurality of wiring patterns in a region of the lead region adjacent to the overlap region, and wherein the part of the anisotropic conductive material is placed on the part exposed from the coating layer of the plurality of wiring pattern in the lead region.

9. The display device according to claim 7, wherein the flexible wiring board includes a coating layer that covers the plurality of wiring patterns in the lead region, wherein the coating layer is formed to expose a part of the plurality of wiring patterns in a region of the lead region adjacent to the overlap region, and wherein the part of the anisotropic conductive material is placed on the part exposed from the coating layer of the plurality of wiring patterns in the lead region.

* * * * *